United States Patent [19]

Howson

[11] Patent Number: 5,291,056
[45] Date of Patent: Mar. 1, 1994

[54] ELECTRONIC SWITCH COMPRISING A PHOTOSENSITIVE SEMICONDUCTOR

[75] Inventor: Peter A. Howson, Brighton, Great Britain

[73] Assignee: Cooper Industries, Inc., Houston, Tex.

[21] Appl. No.: 7,949

[22] Filed: Jan. 26, 1993

Related U.S. Application Data

[63] Continuation-in-part of Ser. No. 752,110, Aug. 29, 1991, abandoned.

[30] Foreign Application Priority Data

Aug. 31, 1990 [GB] United Kingdom ............... 9018957.2

[51] Int. Cl.$^5$ .......................................... H01L 27/14
[52] U.S. Cl. ...................................... 257/442; 257/448; 257/614; 250/214.1
[58] Field of Search ............... 250/211 R, 211 J, 551; 385/16, 17; 338/15; 437/5; 257/431, 432, 80, 82, 442, 448, 614

[56] References Cited

U.S. PATENT DOCUMENTS

| | | | |
|---|---|---|---|
| 3,443,103 | 5/1969 | Lakshmanan | 250/211 R |
| 3,558,920 | 1/1971 | Glaever | 250/211 |
| 4,069,356 | 1/1978 | Fischer | 427/76 |
| 4,301,362 | 11/1981 | Mourou | 250/211 P |
| 4,494,132 | 1/1985 | Kohn | 357/30 D |
| 4,577,114 | 3/1986 | Levy et al. | 250/211 R |
| 4,695,733 | 9/1987 | Pesavento | 250/551 |
| 4,781,442 | 11/1988 | Koster et al. | 250/211 R |
| 5,028,971 | 7/1991 | Kim et al. | 357/30 |
| 5,051,789 | 9/1991 | Rosen et al. | 357/19 |

Primary Examiner—Rolf Hille
Assistant Examiner—Minhloan Tran
Attorney, Agent, or Firm—William B. Patterson; Eddie E. Scott; Alan R. Thiele

[57] ABSTRACT

An electronic switch comprises a photosensitive semiconductor (1,11,12) and a light source (14,24) which, when actuated, illuminates the semiconductor and causes the latter to become conductive, the photosensitive semiconductor being a sintered mixture comprising, by weight, 58–72% of cadmium, 14.8–21% of selenium, 7–15% of tellurium, 7–12% of sulphur, 0.1–1% of chlorine, and 0.005–0.1% of copper.

12 Claims, 3 Drawing Sheets

ELECTRONIC SWITCH COMPRISING A PHOTOSENSITIVE SEMICONDUCTOR

This is a continuation-in-part of copending application Ser. No. 07/752,110 filed on Aug. 29, 1991, now abandoned.

BACKGROUND

The present invention relates to an electronic switch comprising a photosensitive semiconductor and a light source which, when actuated, illuminates the semiconductor and causes the latter to become conductive.

Photosensitive semiconductors are well known and need not be described in detail. The main characteristic of such semiconductors is their ability to pass from an electrically non-conductive and high resistance state to an electrically conductive and low resistance state when they are illuminated with light.

Materials presently used as or in industrial photosensitive semiconductors are for example : silicon, carbon, germanium, gallium arsenide, silicon carbide, cadmium selenide, cadmium sulphide, indium phosphide, and potassium phosphide. These prior art photosensitive seiniconductors can be used in various electronic devices, for example, in electronic switches, and are generally doped with "impurities" such as, for example cobalt, copper, chromium, gold, iron, oxygen, silver, and zinc.

Electronic switches comprising a photosensitive semiconductor are described, for example, in the following U.S. Pat. Nos.: 4,301,362; 4,347,437; 4,438,331; 4,490,709; 4,577,114 and 4,695,733. Various configurations of switches are described in these patents. They all comprise a light source and a photosensitive semiconductor provided with two spaced electrodes. The semiconductors are made of various materials and the light source is generally a laser.

When, for a given semiconductor, a certain bias voltage is applied across the electrodes of a photosensitive switch, the semiconductor will not permit the electrical current to pass between the electrodes and the switch will be in its "off" position, but when the light source projects light energy on to the area of the semiconductor located between the electrodes the semiconductor becomes electrically conductive and the switch will be in its "on" position. The main advantage of switches of this type is that they can switch an electrical current on or off very rapidly.

A disadvantage of known photosensitive switches and, in particular, of the switches disclosed in the above six U.S. patents is that they are only capable of switching electrical supplies which have voltages of a few kV, for example up to 3–5 kV, and thus cannot be used in electrical devices where a higher voltage is required.

SUMMARY

It is therefore a first object of the invention to provide an electronic switch activated by light that is capable of withstanding/switching high voltage, low amperage electrical currents, that is electrical supplies having a voltage of at least 30 kV and having an amperage of less than 0.2 A. It is a further object of the invention to provide a very compact and a very economical high voltage, low amperage photosensitive switch and it is also an object of the invention to provide a photosensitive switch capable of operating with a high pulse repetition rate.

We have now found that certain doped cadmium sulpho-selenide-telluride semiconductor compositions have a desirable combination of properties such that when used as the semiconductor in a photosensitive switch, the latter is capable of switching high voltage, low amperage electrical supplies and can be constructed compactly and cheaply and can be operated at a high pulse repetition rate.

According to the present invention, there is provided an electronic switch comprising a photosensitive semiconductor and a light source which, when actuated, illuminates the semiconductor and causes the latter to become conductive, in which the photosensitive semiconductor is a sintered mixture comprising, by weight, 58 to 72% of cadmium, 14.8 to 21% of selenium, 7 to 15% of tellurium, 7 to 12% of sulphur, 0.1 to 1% of chlorine, and 0.005 to 0.1% of copper.

The semiconductor is preferably in the form of an adherent layer on an electrically insulating substrate. The semiconductor is provided with spaced electrodes to which, in use, the circuit which the switch is to control is connected. The electrodes may be two adherent, spaced electrode layers on the sintered semiconductor layer or the substrate may be provided with two adherent, spaced electrode layers and the adherent sintered semiconductor layer may be applied over the electrode layers and the substrate between them; in the latter case the electrode layers are below the semiconductor layer.

The electrode layers may be formed of any suitable electrically conductive material, preferred materials being, for example, silver, gold, indium and aluminium and resins, for example epoxy resins, loaded with any one or more of these metals.

According to another aspect of the present invention, there is provided a method of making an electronic switch according to the invention, which comprises forming a paste of a finely divided powder mixture comprising, by weight, 32 to 47% of cadmium selenide, 32 to 49% of cadmium sulphide, 7 to 15% of tellurium, 4.7 to 13% cadmium chloride, and 0.01 to 0.1% of copper chloride, a binder and a volatile liquid, forming a coating of the paste on an electrically insulating substrate and drying the coating, sintering the dried coating at a temperature of from 510° C. to 800° C. to form an adherent layer of photosensitive semiconductor on the substrate, providing adherent spaced electrode layers either on or below the semiconductor layer, and assembling the coated substrate with a light source.

The formation of the sintered semiconductor layer may be carried out in accordance with conventional sintering techniques which will be well known to those skilled in the art.

In order to obtain the desired photosensitivity and electrical properties in the sintered semiconductor, the finely divided powder materials must be of the highest purity, for example of 99.999% or more, and the size of the powder particles is preferably less than 3 $\mu$m.

Suitable binders and volatile liquids for forming the paste will be known to those skilled in the art. It is generally preferred to use ethyl cellulose as the binder, but other suitable binders include, for example, linseed oil and cellulose acetate. Preferred volatile liquids are organic liquids; suitable organic liquids include, for example, turpineol, acetone and ethanol, of which the first is generally preferred. The binder is preferably present as a 10% by weight solution in the volatile liquid. The proportion of binder/volatile liquid solution in the paste will, of course, depend on the desired viscosity of the paste which will, in turn, depend on the method of coating the substrate with the paste which is used. For many purposes, a paste containing about 15% by weight of the binder/volatile liquid solution is suitable.

Suitable methods of forming a layer of the paste on the substrate include, for example, screen printing, spraying, spinning and sedimentation. Screen printing is a very precise method that produces a layer having a smooth, even surface and a thickness of 10 to 50 μm depending on the mesh of the screen; this method is generally preferred.

Suitable electrically insulating substrate materials are, for example, alumina ceramics, fused silica and "Pyrex" glass (Trade Mark).

The coated substrate is then dried to remove the volatile liquid, preferably by heating in an oven at a temperature of about 100° C. for about 10 minutes.

The dried coating is then sintered in a substantially inert atmosphere at a temperature of from 510° C. to 800° C. For this purpose the coated substrate is preferably placed in a container through which a stream of nitrogen (or other inert gas) containing a small proportion of oxygen, preferably added as air, can be passed and the container is placed in a suitable oven or furnace, preferably an electrical furnace. The proportion of air in the inert gas/air mixture is suitably 1 to 3% by volume. The inert gas/air mixture is passed through the container at a relatively slow rate, for example 2 to 6 liters per hour.

The furnace is gradually heated to the sintering temperature, for example over a period of 30 minutes, and is held at the sintering temperature for 10 to 60 minutes, preferably 10 to 20 minutes. The sintering temperature does not appear to be critical; if the temperature is much less than 510° C., the layer fails to sinter and if it is more than 800° C., the layer decomposes. Best results are obtained at sintering temperatures of from 520° C. to 700° C.

The sintered layers thus obtained are firm, adherent and chemically stable. A reduction of thickness takes place during the sintering operation and the final thicknesses are generally in the range of 5 to 25 μm, depending on the initial thickness of the layer. There is also always a loss of weight during sintering and the final chemical composition of the semiconductor may vary somewhat as a function of the sintering temperature and as a function of the sintering time.

In a modification of this process, the copper content of the semiconductor is not provided by the inclusion of copper chloride in the initial powder mixture, but is provided by evaporating a thin layer of copper metal on to the surface of the semiconductor layer after the latter has been applied to the substrate and dried and before it is fired (the copper chloride being omitted, in this case, from the initial powder mixture). During the firing stage, the thin layer of copper diffuses into the semiconductor layer so as to incorporate therein a very precise and uniform copper content. The thickness of the evaporated copper layer should be monitored during deposition by suitable apparatus, such as an Edwards evaporated film thickness monitor which is accurate to a resolution of 0.1 nm.

It is preferred to form evaporated copper layers having a thickness of from 0.5 nm to 2.0 nm which give rise to final copper contents of from 0.007% to 0.028%. It has been found that by using this method, the photosensitivity and speed of response of the semiconductor layer can be carefully and consistently controlled by varying the thickness of the evaporated copper layer by as little as 0.2 nm.

The sintered semiconductor layer is then provided with two spaced electrodes which can be made, for example, of silver, gold, indium, or aluminium or of an epoxy resin loaded with one of these metals. Suitable methods of forming the electrodes on the semiconductor include, for example, (a) evaporating the electrode metal on to the surface of the semiconductor, (b) screen printing the loaded epoxy resin on to the surface, and (c) pressing a foil of the metal on to the surface of the semiconductor.

Of these three methods, methods (a) and (b) are generally preferred. In both methods, the area between the electrodes is masked before applying the electrode material on to the surface of the semiconductor. Method (a) is usually followed by a short heat treatment which, when silver or aluminium is used, consists, for example, of heating the electrode layer in nitrogen at 300° C. for 20 minutes. Method (b) requires that the epoxy resin is heated in air, for example, at 150° C. for 35 minutes, in order to harden the layer.

Another method for providing the semiconductor with two spaced electrodes consists of forming the electrodes as layers on the electrically insulating substrate, for example, by any of the methods described above, while masking the area between the electrodes and then forming the semiconductor layer over the electrodes and the area of substrate between them.

This procedure, that is the provision of the electrode layers below the semiconductor layer, is preferred to the provision of the electrode layers over the semiconductor layer since the former procedure greatly increases the effective area of the electrodes (since the part of the semiconductor layer lying above the electrode layers can be illuminated and rendered conductive) which, in turn, significantly decreases the electric resistance of the electrodes to high surge currents.

In this procedure, the preferred electrode material is gold. A preferred method of forming gold electrode layers consists of silk screen printing a conventional fritless gold thick film conductor paste onto the surface and then firing the coated substrate at 900° C. Such fritless gold pastes typically comprise 99% pure finely powdered gold which when fired, fuse onto the surface of the substrate to form a robust conductive gold layer which is preferably approximately 5 μm in thickness.

An alternative, and less preferred, method of forming gold electrode layers is by evaporation.

We have found that the ability of electronic switches according to the invention to withstand electric field strengths in excess of 10 kV/cm over a prolonged period is in most cases improved by providing a so-called "stress relieving" layer between the electrically insulating substrate and the semiconductor layer. Stress relieving coatings are used in electrical insulation technology to deal with the problems caused by uneven electrical fields across the surface of high voltage electrical insulators; they essentially comprise a material which exhibits non-linear resistance in that it permits a disproportionate increase in current with an increase in electrical potential. Suitable materials of this kind include, for example, finely divided zinc oxide and silicon carbide. The electrical characteristics of coatings containing these materials are largely determined by the size and density of the particles, rather than the electrical properties of each particle. Generally the materials show very little electrical conductivity up to a certain threshold value where conduction rapidly increases with a rise in electrical potential.

The procedure for forming a stress relieving layer on the substrate depends on whether the non-linear resistive material can be sintered to form a coherent and adherent layer at acceptable temperatures, that is up to, say, 1100° C. Zinc oxide can be sintered at temperatures of 1000°-1100° C., but silicon carbide can not. Materials of the latter kind, such as silicon carbide, are mixed with a suitable electrically insulating vitreous glaze, such as a vitreous borosilicate glaze which can be sintered at a temperature of about 900° C.

A preferred zinc oxide-based stress relieving layer comprises, by weight:

| | |
|---|---|
| zinc oxide | 96.4% |
| manganese oxide | 1.1% |
| bismuth oxide | 1.0% |
| antimony oxide | 1.0% |
| cobalt oxide | 0.5% |

Powders of these oxides are mixed and ground in a microliser, and the resulting powder mixture is mixed with turpineol or other suitable liquid medium to form a paste for screen printing as described above for the semiconductor layer. The paste is printed, dried and fired at a temperature of 100020 -1100° C. in air to obtain a layer having a thickness of 8 to 10 pm.

For the other type of non-resistive material, such as silicon carbide, which cannot be sintered on its own, a range of electrically insulating vitreous glazes is commercially available and any of these glazes can be used provided they are compatible with the non-linear resistive material. The mixture of glaze and non-linear resistive material suitably comprises from 25 to 75% by weight of the latter; it has been found that the threshold value of the electrical characteristic can be changed by varying the relative proportions of these components.

In general, it is preferred to use a stress relieving layer which does not contain a glaze. With glaze-containing stress relieving layers, it is found that when the semiconductor layer is fired there is a tendency for components of the stress relieving layer to diffuse into the semiconductor layer and this has the effect of reducing the photosensitivity of the latter and in some cases of making the photosensitivity unstable. Products having zinc oxide-based stress relieving layers as described above are more photosensitive and much less subject to instability than are products comprising glaze-containing stress relieving layers.

The electronic switch according to the invention may take a number of forms. For reasons of compactness it is preferred that the semiconductor layer and the substrate should have the form of a hollow cylinder. It is further preferred that in this arrangement the semiconductor layer should be on the inside of the hollow cylinder and the light source should be located on the longitudinal axis of the cylinder.

A variety of light sources may be used. It is preferred to use one or more light emitting diodes (LEDs) or a glow discharge lamp or tube giving light having a wavelength of 500 to 900 nm. Suitable LEDs include high efficiency red LEDs with a peak emission of about 660 nm visible red light and a viewing angle of 900 or 1400, and infra-red LEDs which emit a peak emission of 830 nm and have a viewing angle of more than 30°.

Suitable discharge lamps are, for example neon discharge lam s and tubes.

BRIEF DESCRIPTION OF THE DRAWINGS

For the better understanding of the invention, preferred embodiments of semiconductor/substrate and of switch assemblies will now be described, by way of example, with reference to the accompanying drawings, in which.

DESCRIPTION OF THE PREFERRED EMBODIMENT

Figure 1:
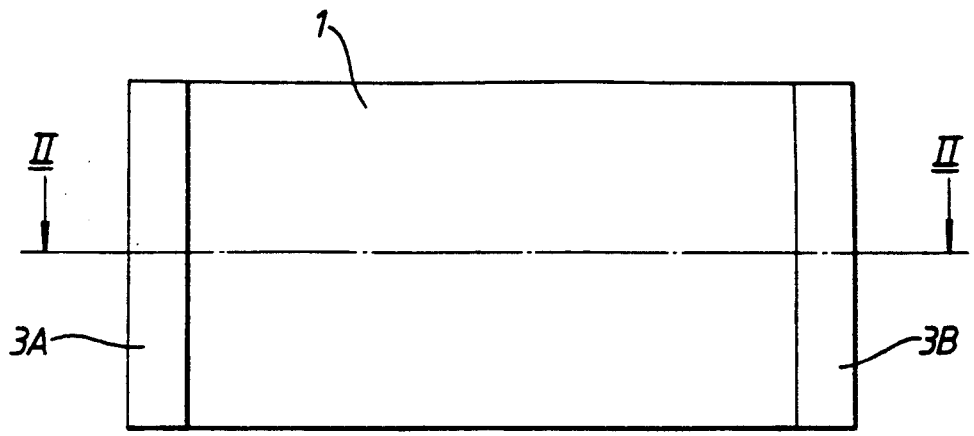
FIG. 1 is a plan view of a semiconductor/substrate embodiment.
Figure 2:
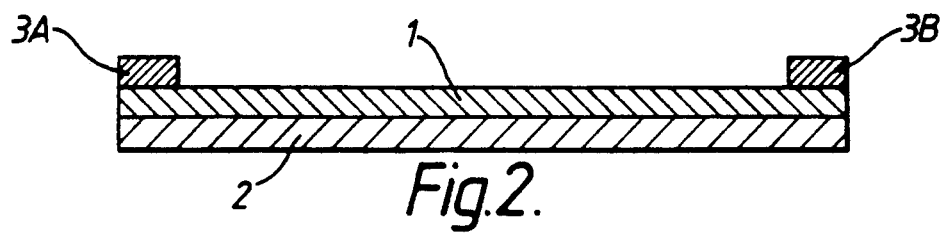
FIG. 2 is a section on line II—II of FIG.

Referring to FIGS. 1 and 2, a semiconductor/substrate assembly comprises a sintered photosensitive semiconductor layer 1 coated on a flat electrically insulating substrate 2 and spaced electrically conducting electrodes 3A and 3B. The semiconductor layer 1 has the Cd/Se/Te/S/Cl/Cu composition referred to above.

Figure 3:
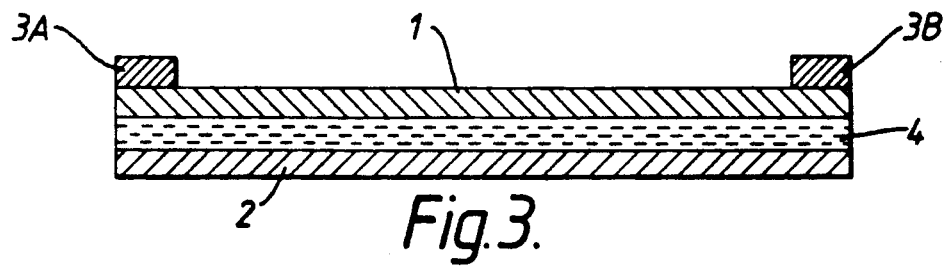
FIG. 3 is a section similar to that of FIG. 2 of a second semiconductor/substrate embodiment.

The semiconductor/substrate assembly shown in FIG. 3 is similar to that shown in FIGS. 1 and 2, but additionally comprises an electrical stress relieving layer 4 as described above.

Figure 4:
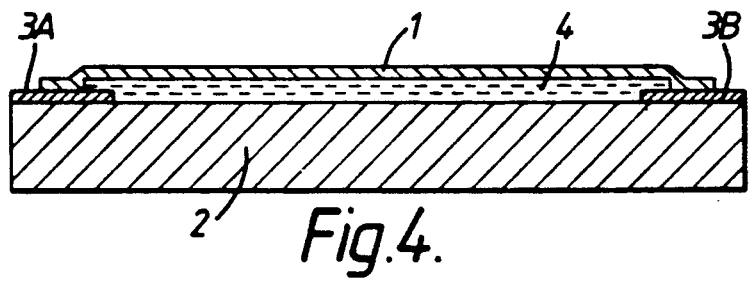
FIG. 4 is a section similar to that of FIG. 2 of a third semiconductor/substrate embodiment.

The semiconductor/substrate assembly shown in FIG. 4 is generally similar to that shown in FIG. 3, but the electrically conducting electrodes 3A and 3B are positioned directly on the substrate 2 and are overlaid by the semiconductor layer 1 and the stress relieving layer 4.

In this arrangement, the electrodes are preferably formed of gold as described above. In a specific embodiment of this arrangement, the stress relieving layer 4 overlaps each electrode 3A, 3B by approximately 2 mm and the semiconductor layer overlaps each electrode by 2 to 3 mm.

The semiconductor/substrate assembly shown in FIG. 5 is again generally similar to that shown in FIG. 3, the whole of the substrate 2 being covered by the stress relieving layer 4. The electrodes 3A and 3B are formed on the stress relieving layer 4 and the semiconductor layer 1 overlaps the electrodes 3A and 3B. In this arrangement, the electrodes are preferably formed of gold as described above.

Figure 5:
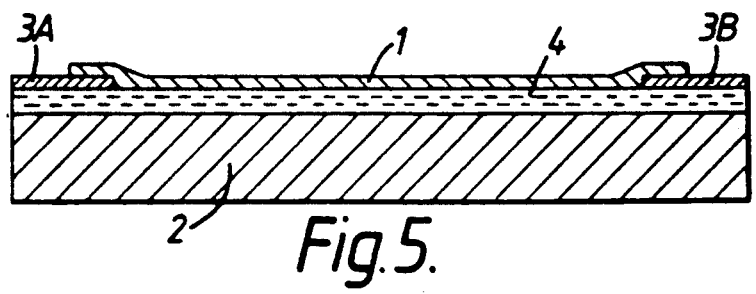
FIG. 5 is a section similar to that of FIG. 2 of a fourth semiconductor/substrate embodiment.

As previously indicated, the advantage of the arrangements shown in FIGS. 4 and 5 over the arrangements shown in FIGS. 1, 2 and 3 is that the former (FIGS. 4 and 5) allows the portions of the semiconductor layer which overlie the electrodes 3A, 3B to be illuminated and thus rendered conductive. The contact area between the semiconductor layer and the electrode layers is, therefore, greatly increased.

Of the two arrangements shown in FIGS. 4 and 5, that of FIG. 4 is preferred. The arrangement of FIG. 5 is, however, necessary if the stress relieving layer 4 needs to be fired at a temperature in excess of the sintering temperature used for forming the electrode layers 3A, 3B.

Figure 6:
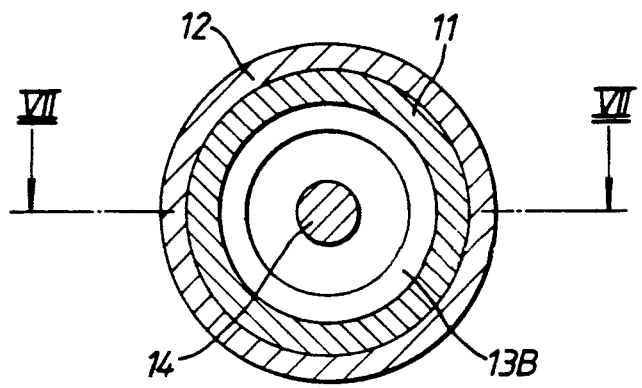
FIG. 6 is a cross-section of a first embodiment of a cylindrical electronic switch assembly.
Figure 7:
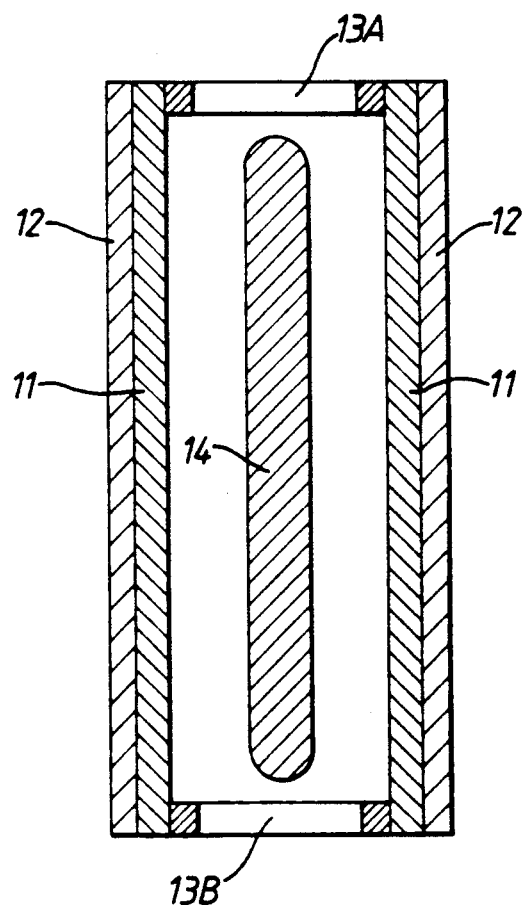
FIG. 7 is a sectional elevation on line VII—VII of FIG. 6.

The electronic switch shown in FIGS. 6 and 7 comprises an adherent sintered photosensitive semiconductor layer 11 and an insulating substrate 12 in the form of a hollow cylinder, and two annular electrodes 13A and 13B at each end of the cylinder. The switch further comprises a light source 14 which is a discharge tube giving light having a wavelength of 500 to 900 nanometers; the light source 14 is arranged along the axis of the cylinder 11/12. The semiconductor layer 11 has the Cd/Se/Te/S/Cl/Cu composition referred to above.

Figure 8:
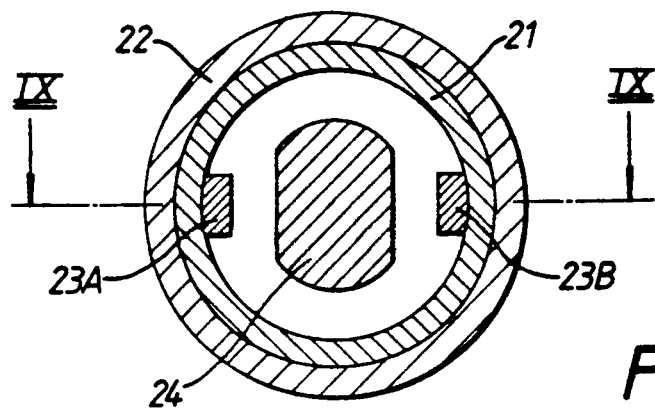
FIG. 8 is a cross-section of a second embodiment of a cylindrical electronic switch assembly.
Figure 9:
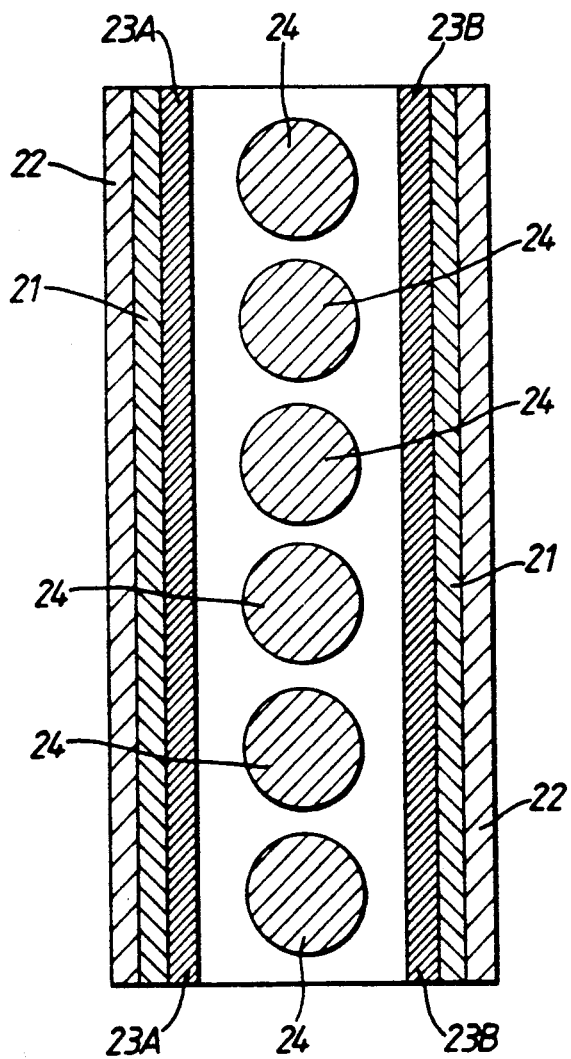
FIG. 9 is a sectional elevation on line IX—IX of FIG. 8.

The electronic switch shown in FIGS. 8 and 9 comprises hollow cylindrical semiconductor layer 21 and insulating substrate 22 similar to the semiconductor layer 11 and the substrate 12 of the previous embodiment, but in this embodiment the electrodes take the form of two elongated strip electrodes, 23A and 23B, arranged along diametrically opposed generators of the cylinder 21. The switch assembly further comprises six light emitting diodes 24 arranged along the axis of the cylinder 21/22. The semiconductor layer 21 has the Cd/Se/Te/S/Cl/Cu composition referred to above.

The operation of the electronic switches shown in FIGS. 6 and 7 and FIGS. 8 and 9 is as follows. A bias voltage is applied across the electrodes (13A–13B, 23A–23B); n, significant current flows as long as the light source (14,24) is not illuminated and as soon as it is illuminated the current passes.

Electronic switches as illustrated can be made very compact. The properties of the semiconductors described are such that the switches can safely handle voltage pulses of up to 30 kV and DC voltages of up to 30 Kv with a spacing between the electrodes of as little as 10 or 20 mm.

In order that the invention may be more fully understood, the following example, in which all percentages are by weight unless otherwise stated, is given by way of illustration only.

EXAMPLE 1

A powder mixture of the following composition:

| | |
|---|---|
| cadmium selenide | 33.3% |
| cadmium sulphide | 47.7% |
| tellurium | 10% |
| cadmium chloride | 8.92% |
| copper (cupric) chloride | 0.08% | was formed and then dry ground in a mechanical grinder, such as a microliser, to obtain a homogeneous mixture in which all particles were less than 3 um in size.

A 10% solution of ethyl cellulose in turpineol was mixed with the powder mixture, the amount of the solution being 15% of the combined weights of the solution and the powder mixture. Mixing was continued until a smooth paste was obtained.

The paste was applied to the surface of a high density 96% alumina ceramic substrate of the kind used for the production of thick film circuits, by silk screen printing. The substrate had the dimensions 5 cm × 3.5 cm × 0.05 cm and the paste was printed to cover a rectangular area of 4 cm × 2.5 cm. A 305 mesh screen material was used which gave a layer of paste approximately 15 um in thickness.

The coated substrate was placed in an oven and heated to 100° C. for 10 minutes to evaporate the turpineol.

The coated substrate was then placed in a Pyrex glass container having a top cover of the same material. Gas could be introduced into one end of the container through a Pyrex glass tube and could be vented from the opposite end through a gap between the container and its top cover. This assembly was placed in an electrically heated furnace.

Prior to heating, pure nitrogen was first passed through the container at a flow rate of 4.5 liters per hour for a period of 20 minutes to purge out the bulk of the air that was initially present. The furnace was then heated to 520° C. over a period of 50 minutes while continuing to pass pure nitrogen. Once a temperature of 520° C. has been attained, a small proportion of air, that is 3% by volume, was added to the nitrogen and flow of this mixture was continued at 4.5 liters per hour. The temperature of 520° C. was maintained for 10 minutes and at the end of this period, the furnace was turned off and allowed to cool over a period of 60 to 90 minutes. The flow of the nitrogen/air mixture is continued until the furnace had cooled to below 150° C. Thereafter air could be blown through the furnace to accelerate cooling.

The sintered layer obtained was firm, adherent and chemically stable. There was an approximately 40% reduction in the thickness of the layer. Electron microscope studies of the surface of the sintered material showed that the latter consisted primarily of large grains of about 9 um fused together at the grain boundaries.

Indium was then evaporated onto the marginal portions of the long sides of the substrate to form electrodes. For this purpose a metal mask was positioned to cover all of the sintered composition apart from a 1.5 mm wide marginal zone along each long edge. Indium was then evaporated using a conventional metal evaporation apparatus to coat the masked substrate. The mask was then carefully removed; the thickness of the indium coating was 0.5 um. The coated substrate was placed in an oven and heated to 160° C. for 15 minutes to cause fusion of the indium to the surface of the sintered composition.

The final product accordingly had a band of the sintered composition about 17 mm wide (between the long sides of the substrate) and an indium electrode strip about 4 mm wide on either side of the sintered composition and extending to the long edges of the substrate.

To form the switch, six light emitting diodes (LEDs) of the visible light type were mounted on a piece of printed circuit board measuring 5 cm × 3.5 cm in two rows of three running across the width of the board. Each row was positioned with its centre at 1.8 cm from each end and the LEDs were arranged to be equally spaced along the length of the row. Each row of three LEDs was connected electrically in series and the two rows were connected in parallel to form a common drive connection. The array of LEDs was mounted over the surface of the semiconductor on the substrate with a spacing of 3 mm from the surface to the tip of each LED. The assembly of the LEDs board and the coated substrate were mounted in a rigid plastics frame that electrically insulated the coated substrate from the LEDs. Electrical connections were made to the indium electrodes on each edge of the substrate. The whole assembly was then immersed in transformer oil to prevent electrical flashover from occurring across the surface of the semiconductor layer.

The LEDs used were high efficiency red diodes with a peak emission of 660 nm visible red light and a viewing angle of 140°. Their light output for a current of 20 ma was 200 mcd (0.2 candela); for pulsed current operation, the light output for 100 ma pulses was typically 1 candela at 25° C.

The electrical properties of the switch were as follows:

Dark Conditions

The following properties were recorded with the switch immersed in transformer oil at a temperature of 25° C. and in total darkness.

For a DC voltage of 30 kV applied across the semiconductor contacts, a current of less than 30 uA was recorded; this corresponds to a switch dark resistance of more than 1000 mega ohms.

Electrical breakdown of the semiconductor occurred at a DC voltage of 35–40 kV from tests carried out on several samples.

Illuminated Conditions

The following properties were recorded with the switch immersed in transformer oil at a temperature of 25° C. and the following illumination conditions.

| Diode Forward Current, | current pulses of 3 ms duration and magnitudes greater than 0.15, at pulse repetition frequency 50 per second. |
|---|---|

Time response Test

A 500 volt DC bias was applied across the semiconductor layer contacts and the above forward current conditions applied to the diodes causing pulses of current to be generated in the 500 volt bias circuit. The characteristics of these pulses were as follows:

| peak current recorded; | 1.5 mA |
|---|---|
| time from minimum current to maximum current where zero time marks the beginning of the illumination pulse | 0.75 ms |
| time for the current to fall to 1% of the peak value following termination of the diode current pulse | 5.7 ms |
| estimated minimum resistance | 270,000 ohms |

I claim:

1. An electronic switch comprising a photosensitive semiconductor layer and a light source switch, when actuated, illuminates the photosensitive semiconductor layer and causes said photosensitive semiconductor layer to become conductive through a photoconductive effect in which the photosensitive semiconductor layer is sintered mixture comprising, by weight, 58 to 72% of cadmium, 4.8 to 21% of selenium, 7 to 15% of tellurium, 7 to 12% of sulphur, 0.1 to 1% of chlorine, and 0.005 to 0.1% of copper.

2. A switch according to claim 1, in which the photosensitive semiconductor layer is in the form of an adherent layer on an electrically insulating substrate.

3. A switch according to claim 2, which comprises two adherent, spaced electrode layers on said photosensitive semiconductor layer.

4. A switch according to claim 1, which comprises an electrically insulating substrate, two adherent, spaced electrode layers on the substrate, and the photosensitive semiconductor layer overlying the electrode layers.

5. A switch according to claim 4, in which the electrode layers are formed of silver, gold, indium or aluminum or an epoxy resin loaded with silver, indium or aluminum.

6. A switch according to claim 5, in which a stress relieving layer is provided between the electrically insulating substrate and the photosensitive semiconductor layer, the stress relieving layer being adherent to the substrate and comprising a finely divided non-linear resistive material.

7. A switch according to claim 6, in which the stress relieving layer consists essentially of a sintered layer of zinc oxide.

8. A switch according to claim 6, in which the stress relieving layer consists essentially of a sintered mixture of silicon carbide and an electrically insulating vitreous glaze.

9. A switch according to claim 8, in which the photosensitive semiconductor layer the substrate and the stress relieving layer have the form of a hollow cylinder.

10. A switch according to claim 9, in which the light source is located on the longitudinal axis of the cylinder.

11. A switch according to claim 10, in which the light source is at least one light emitting diodeS.

12. A switch according to claim 10, in which that the light source is a glow discharge lamp giving light having a wavelength of 500 to 900 nanometers.

* * * * *